(12) United States Patent
Diamond et al.

(10) Patent No.: US 10,690,725 B2
(45) Date of Patent: Jun. 23, 2020

(54) BATTERY STATE-OF-CHARGE ESTIMATION

(75) Inventors: Steven Diamond, San Mateo, CA (US); Gabriel Risk, San Francisco, CA (US); Stanley Hu, San Francisco, CA (US); Albert Shih-Young Liu, Palo Alto, CA (US); Martin Helliwell, Morgan Hill, CA (US)

(73) Assignee: ATIEVA, INC., Newark, CA (US)

( * ) Notice: Subject to any disclaimer, the term of this patent is extended or adjusted under 35 U.S.C. 154(b) by 1444 days.

(21) Appl. No.: 13/434,707

(22) Filed: Mar. 29, 2012

(65) Prior Publication Data
US 2013/0257377 A1   Oct. 3, 2013

(51) Int. Cl.
  *H02J 7/00*  (2006.01)
  *G01R 31/3835*  (2019.01)
(52) U.S. Cl.
  CPC ........ *G01R 31/3835* (2019.01); *H02J 7/0048* (2020.01)
(58) Field of Classification Search
  CPC ............................ H02J 7/0016; G01R 31/3835
  USPC .......................................................... 320/118
  See application file for complete search history.

(56) References Cited

U.S. PATENT DOCUMENTS

| | | | | |
|---|---|---|---|---|
| 5,675,258 A * | 10/1997 | Kadouchi | .......... | G01R 31/3624 324/427 |
| 5,760,587 A * | 6/1998 | Harvey | ................. | G01R 31/007 320/106 |
| 5,825,155 A * | 10/1998 | Ito | .................... | G01R 19/16542 320/118 |
| 5,850,134 A * | 12/1998 | Oh | ........................ | H01M 10/42 320/106 |
| 5,998,967 A * | 12/1999 | Umeki | .............. | H01M 10/4257 320/122 |
| 6,020,717 A * | 2/2000 | Kadouchi | ........... | B60L 11/1851 320/116 |
| 6,020,743 A * | 2/2000 | Reeves | ............ | G01R 19/16542 324/433 |
| 6,060,864 A * | 5/2000 | Ito | .................... | G01R 19/16542 320/134 |
| 6,064,178 A * | 5/2000 | Miller | .................. | H02J 7/0016 320/117 |
| 6,304,061 B1 * | 10/2001 | Toya | .................. | H01M 10/441 320/128 |
| 6,608,482 B2 * | 8/2003 | Sakai | .................... | B60K 6/445 320/132 |

(Continued)

Primary Examiner — Drew A Dunn
Assistant Examiner — Tessema Kebede
(74) Attorney, Agent, or Firm — Womble Bond Dickinson (US) LLP (57) ABSTRACT

A battery pack management system adjusts the relative state-of-charge of respective battery blocks in a battery pack to equalize (i.e., align, balance or otherwise make similar) the peak battery block voltages (i.e., maximum or "upper peak" battery block voltages when the battery pack is being charged and/or minimum or "lower peak" battery block voltages when the battery is being discharged). Upon detecting an anomalous battery block that exhibits outlier upper and lower peak voltages, the battery pack management system adjusts the relative state of charge of respective battery blocks to center their respective upper and lower peak voltages between operating limits, thus maximizing the operating margin of the battery pack as a whole.

20 Claims, 10 Drawing Sheets

(56) References Cited

U.S. PATENT DOCUMENTS

| | | | | |
|---|---|---|---|---|
| 7,508,166 | B2* | 3/2009 | Ishikawa | H02J 7/0016 320/116 |
| 7,566,828 | B2* | 7/2009 | Sasaki | H02J 7/35 136/243 |
| 8,315,755 | B2* | 11/2012 | Hirata | B60K 6/365 180/65.28 |
| 8,670,885 | B2* | 3/2014 | Gilman | B60W 50/0097 340/425.5 |
| 9,030,167 | B2* | 5/2015 | Yamaguchi | H01M 10/425 320/117 |
| 2003/0146737 | A1* | 8/2003 | Kadouchi | H02J 7/0019 320/132 |
| 2006/0091857 | A1* | 5/2006 | Nakanishi | B60L 11/1851 320/116 |
| 2006/0238165 | A1* | 10/2006 | Moore | H02J 7/0016 320/118 |
| 2007/0090798 | A1* | 4/2007 | Yun | B60L 3/0038 320/116 |
| 2008/0018308 | A1* | 1/2008 | Daboussi | H02J 7/0016 320/167 |
| 2009/0033282 | A1* | 2/2009 | Ishikawa | H02J 7/0018 320/122 |
| 2009/0085516 | A1* | 4/2009 | Emori | B60L 3/0046 320/118 |
| 2011/0112781 | A1* | 5/2011 | Anderson | G01R 31/3679 702/63 |
| 2012/0001594 | A1* | 1/2012 | Berkowitz | H02J 7/0073 320/118 |
| 2012/0256592 | A1* | 10/2012 | Baughman | H01M 10/482 320/118 |
| 2012/0293129 | A1* | 11/2012 | Naghshtabrizi | H02J 7/0016 320/118 |
| 2014/0049222 | A1* | 2/2014 | Moorhead | H02J 7/0016 320/134 |

* cited by examiner

Fig. 1A

Fig. 1B
'OCV Balancing'

Blocks have undergone 'OCV balancing' to make their OCV values similar. Battery block A SOC (SOCA in Fig. 1A) is higher than battery block B SOC (SOCB in Fig. 1A) even though OCV measurements are similar ($V_R$). Hence battery block A has higher voltage when charging and is thus closer to operating limit as indicated by Operating Margin.

Fig. 1C
'Peak-Equalized Balancing'

Blocks have undergone 'peak-equalized balancing' to make the maximum voltages of each block similar when charging and the minimum voltages similar when discharging. Battery block A SOC has been reduced (SOCA2 in Fig. 1A). Hence battery block A voltage is now similar to battery block B when charging and discharging as the SOCs of the two battery blocks are similar (SOCA2 and SOCB in Fig. 1A). Battery pack operates further from the operating limit, as indicated by Operating Margin 2. which is greater than Operating Margin in Fig. 1B.

Fig. 1D
Anomalous block with high DCR

Battery block C has anomalous behavior and is likely defective with a higher DC resistance. Battery block C has a high voltage when charging and a lower voltage when discharging compared to battery block A. It operates with lower margin than other blocks when both charging and discharging. In this example it operates closer to the operating limit when charging (Operating Margin High < Operating Margin Low).

Fig. 1E
'Margin-Based Balancing'

Battery block C's SOC has undergone 'margin-based balancing' and has been decreased to improve the operating margin while charging (Operating Margin High 2, which is greater than Operating Margin High in Fig. 1D). Battery block C's SOC was decreased rather than increased because the Operating Margin High was less than the Operating Margin Low in Fig. 1D.

Fig. 5
Balance charge in each block based on ESOC

Fig. 6
Update ESOC for each block based on statistics of
block voltage proximity to operating limits

Fig. 7
Create block tags based on relative block voltages

Fig. 8
Update ESOC for each block based on block tags

Fig. 9
Adjust ESOC of anomolous block to
improve overall battery pack performance

BATTERY STATE-OF-CHARGE ESTIMATION

FIELD OF THE INVENTION

The present invention relates to rechargeable battery systems.

BACKGROUND

Conventional battery pack management systems in electric or hybrid-electric vehicles perform occasional charge-balancing operations to equalize the open-circuit voltages (OCV) of constituent blocks of battery cells within the vehicle's battery pack, theoretically normalizing the performance of the battery cells and thus improving the performance of the pack as a whole.

During pack charging and discharging operations, battery cell voltages increase and decrease, respectively, relative to their open-circuit voltages. Because the voltage across any individual battery cell must generally be maintained within specified operating limits to avoid performance degradation (e.g., reduction of the cell's operating life and/or charge storage capacity) and unsafe operation (e.g., overheating which could cause the cell to catch fire), the level of current delivered to or drawn from the battery pack is typically limited to ensure that all cells stay within operating limits.

Unfortunately, despite OCV balancing, not all battery cells exhibit the same voltage change in response to a given charging/discharging current. Consequently, the battery pack tends to suffer from a "weakest link" effect in which the cell exhibiting the worst-case (i.e., largest) voltage change in response to a given charging/discharging current establishes the maximum current that the battery pack can withstand, thus constraining the charging/discharging performance of the battery pack to that of the least healthy cell.

BRIEF DESCRIPTION OF THE DRAWINGS

The present invention is illustrated by way of example, and not limitation, in the figures of the accompanying drawings and in which like reference numerals refer to similar elements and in which.

DETAILED DESCRIPTION

In various embodiments disclosed herein initial estimates of battery pack state of charge (SOC) are refined based on measurements of voltages of constituent battery blocks obtained during battery pack charging and/or discharging operations. The refined SOC estimates may themselves be applied to support other aspects of battery pack management or to provide improved control or status with respect to a battery powered apparatus or vehicle (including passenger-conveying vehicles, powered at least in part by the battery pack, such as hybrid electric or electric vehicles). In a number of embodiments, a battery management system applies the refined SOC estimates and/or the underlying energy-transfer voltage measurements themselves (i.e., battery block voltages obtained during battery block charging or discharging operations) in battery block charge balancing operations. In one embodiment, for example, a battery management system adjusts the relative state-of-charge of respective battery blocks in a battery pack to equalize (i.e., align, balance or otherwise make similar) the peak battery block voltages (i.e., maximum or "upper peak" battery block voltages when the battery pack is being charged and/or minimum or "lower peak" battery block voltages when the battery is being discharged). Upon detecting an anomalous battery block that exhibits outlier upper and lower peak voltages (e.g., both upper and lower peak voltages exceed statistical thresholds), the battery pack management system adjusts the relative state of charge of respective battery blocks to center their respective upper and lower peak voltages between operating limits, thus maximizing the operating margin of the battery pack as a whole. These embodiments provide benefits including, but not limited to a) improved battery pack charging and power delivery performance, b) reduced degradation in battery pack charging and power delivery performance over time and operating conditions, c) increased reliability and safety of the battery pack, d) reduced time, data collection and processing required to create the computational model of battery that predicts the change in battery cell performance over time and operating conditions, and e) improved battery pack capacity estimation accuracy. These and other benefits and advantages may be even more significant when the optimization is performed in battery packs that contain battery cells with varying battery cell chemistries.

Figure 1A:
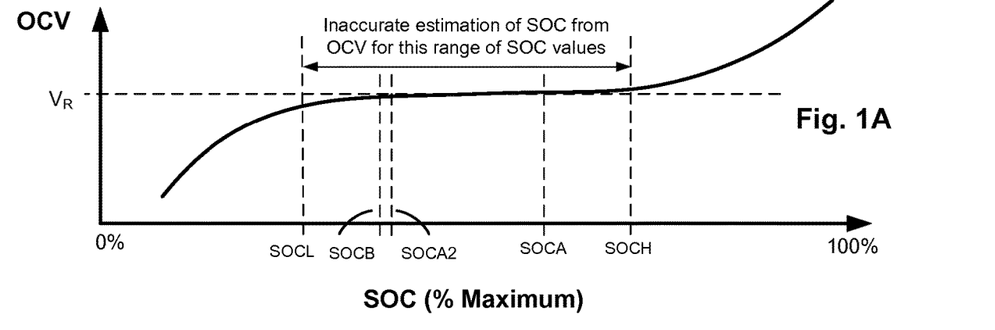
FIG. 1A shows an exemplary chart showing relationship between the open circuit voltage (OCV) and the state-of-charge (SOC) of a battery block.
Figure 1B:
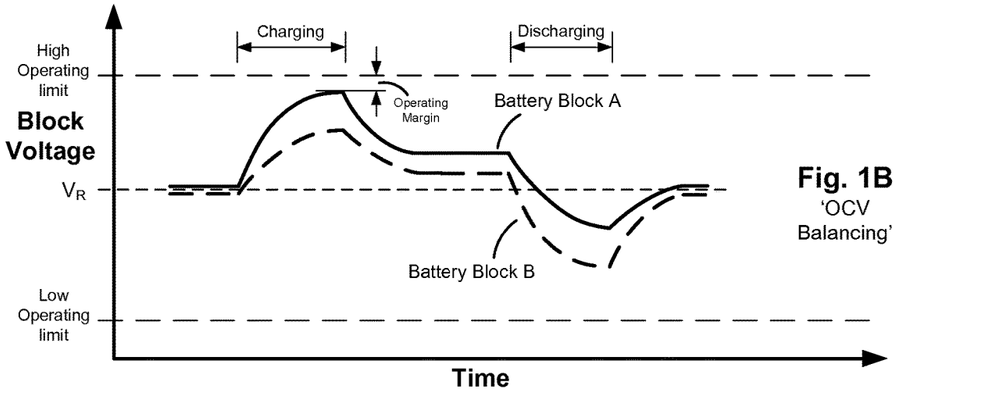
FIG. 1B shows an exemplary chart showing the change in battery cell voltages in response to charging and discharging currents that result from utilizing "OCV Balancing" techniques described herein.
Figure 1C:
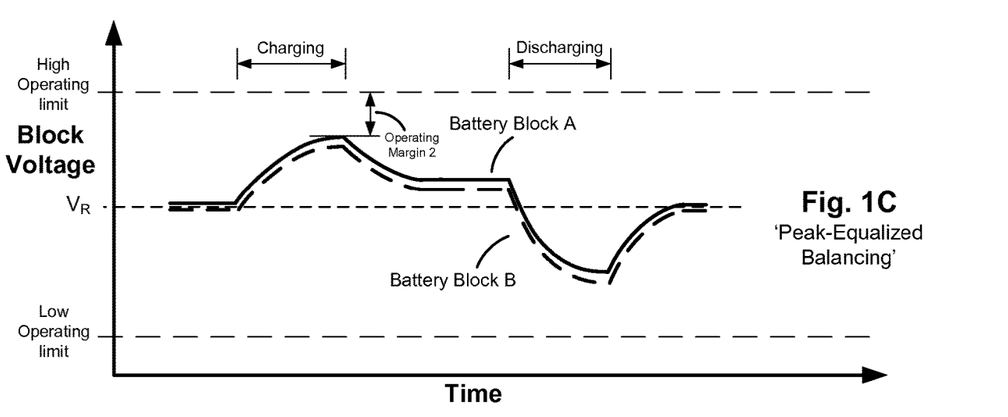
FIG. 1C shows an exemplary chart showing the change in battery cell voltages in response to charging and discharging currents that result from utilizing "Peak-Equalized Balancing" techniques resulting from the various embodiments described herein.
Figure 1D:
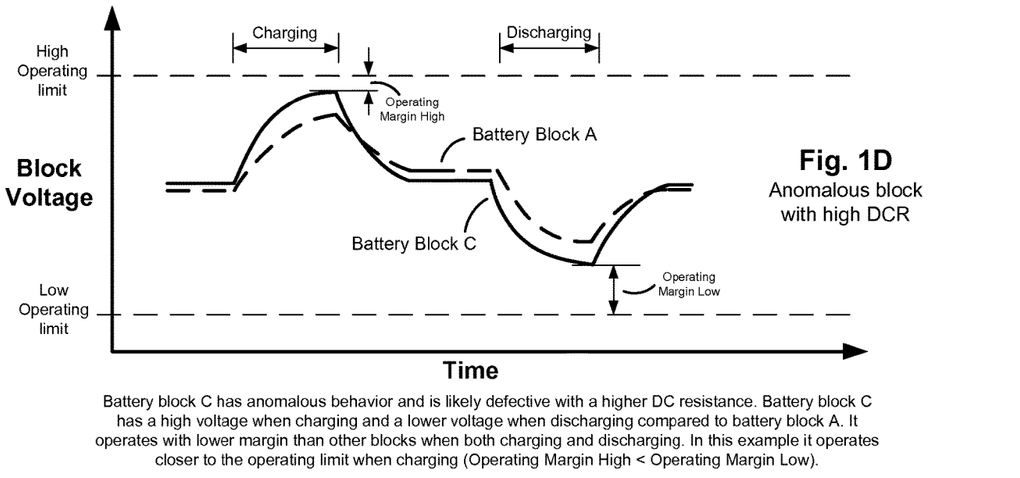
FIG. 1D shows an exemplary chart showing the change in battery cell voltages in response to charging and discharging currents that results from operation of an anomalous battery block with a high DCR.
Figure 1E:
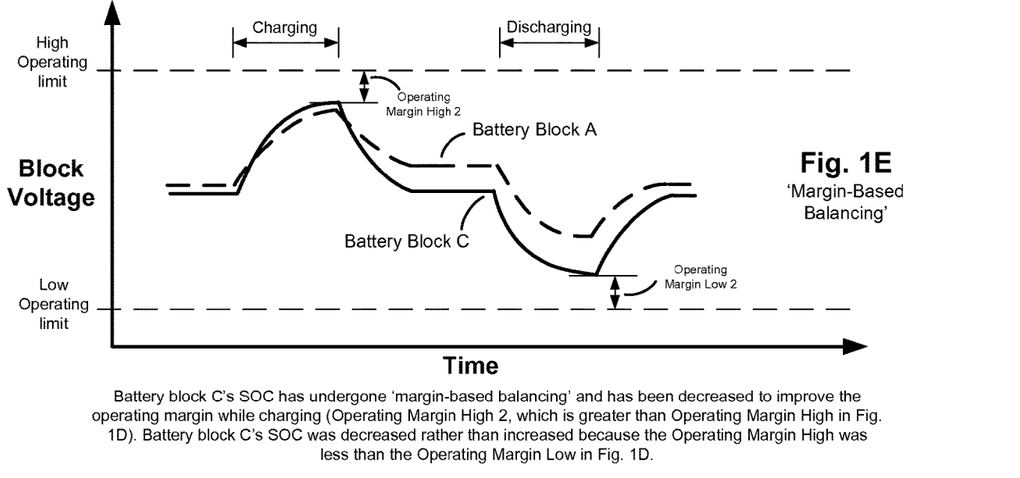
FIG. 1E shows an exemplary chart showing the change in battery cell voltages in response to charging and discharging currents that result from utilizing "Margin-Based Balancing" techniques resulting from the various embodiments described herein.

FIG. 1A illustrates an exemplary relationship between battery cell state-of-charge (SOC) and open-circuit voltage (OCV—also referred to as the "relaxation voltage"). In the central portion of the curve, between SOC values of SOCL and SOCH where the OCV is close to $V_R$, the curve is relatively flat (i.e. a large variation in SOC results in a small variation in OCV). Thus when the OCV for a battery block is measured with a value close to $V_R$, the estimated value of SOC may be inaccurate as small variations in the accuracy of the measurement of OCV will result in larger variations in value of SOC. For further clarification, the value of OCV measured when the SOC value is SOCA could be similar (or within the tolerance of the measurement of OCV) to the OCV value measured when the SOC value is SOCB.

As a result, as shown in FIG. 1B, if battery blocks in a battery pack have been balanced to achieve similar OCV values, their actual SOC values may be different. Consequently, in response to a charging current pulse a battery block with a higher SOC (e.g. Battery Block A with an SOC value of SOCA) may have a voltage closer to the High Operating Limit than a battery block with a lower SOC (e.g. Battery Block B with an SOC value of SOCB). In this example, even though the battery blocks have been "OCV balanced" the overall charging performance of the battery pack is still being limited by a single battery block (Battery Block A) and thus suffers from the "weakest-link" effect described above. More specifically, battery pack charging may need to be stopped prematurely upon detecting that Battery Block A's voltage is nearing the High Operating Limit (i.e., to prevent damage to Battery Block A), even though Battery Block B is well under the limit and could safely accept more charge. Similarly, in response to a discharging current pulse, the Battery Block B voltage drops closer to the Low Operating Limit than Battery Block A so that Battery Block B will limit the overall discharging performance of the battery pack.

In one embodiment, initial SOC estimates generated on the basis of open-circuit voltage (OCV) are refined or improved based on energy-transfer voltage measurements for respective battery blocks. That is, measurements of battery block voltages while charging and/or discharging are received within the battery management system (e.g., via inputs from voltage measuring circuits switchably or permanently coupled to respective battery blocks or from a single or small number of voltage measuring circuits that are switchably coupled to different battery blocks in time-multiplexed fashion) and used to determine or infer offsets between the initial SOC estimate (i.e., the SOC indicated by the open-circuit voltage measurement) and the actual SOC of the battery block. In FIG. 1A, for example, the SOC of battery block A may initially be estimated to be the same as that of battery block B (i.e., due to uniform or nearly uniform OCV measurements), with the disparity between the charging voltages and/or discharging voltages between blocks A and B being applied by the battery management system to calculate a revised SOC estimate that more accurately reflects the actual SOC of battery block A and thus of the pack as a whole. In a number of embodiments, such refined block SOC values are applied to provide more accurate status information to an operator of a system powered by the battery pack. In the case of an electrically-powered vehicle, for example, refined block SOC values may be included in calculations of available instantaneous power or remaining battery capacity and thus used to provide a more accurate fuel gauge reading, transport range (e.g., driving, sailing or flying distance) and so forth. In other embodiments, a number of which are discussed below, battery block charging/discharging voltage measurements that indicate offsets from the initially estimated SOC value are applied by the battery management system to more precisely control charge balancing operations (and/or more accurately balance block SOCs) within a battery pack to improve overall pack performance. In yet other embodiments, also discussed below, battery block charging/discharging voltage measurements are evaluated by the battery management system to identify anomalies in battery block performance, in some cases taking action to minimize the impact of anomalous battery blocks on overall pack performance and/or to alert a system operator of a maintenance concern or hazard.

FIG. 1C illustrates how battery block voltage measurements taken during battery block charging and discharging operations (i.e., during energy-transfer events) may be utilized in various embodiments described herein to improve the accuracy of the estimation of SOC and thus allow balancing of the battery blocks such that they now have more similar actual SOC values. In the example shown, the SOC value for Battery Block A has been reduced from SOCA to SOCA2, which is much closer to the SOC value of Battery Block B. This "Peak-Equalized Balancing" results in more similar voltages across the respective battery blocks during charging and during discharging resulting in voltages further from the respective operating limit. That is, the upper and lower peak voltages (also referred to herein as max/min voltages or charging/discharging extrema) of respective battery blocks are equalized so that the net operating margin (i.e., "Operating Margin 2") is increased relative to the margin in the OCV-balanced example of FIG. 1B. Battery management operations executed to effect peak-equalized balancing of battery block SOC are described in connection with embodiments presented below.

FIG. 1D illustrates exemplary voltages measured across an anomalous (or low-performing or defective) battery block, "Battery Block C," in response charging and discharging pulses. As shown, Battery Block C exhibits anomalous behavior compared to Battery Block A, exhibiting both a higher voltage when charging and a lower voltage when discharging. The combination of a relatively high voltage when charging and a relatively low voltage when discharging may indicate a defective or low performing battery block and/or a defective battery block interconnect. For example, the charging/discharging voltage anomaly may be caused by a high DC resistance ("DCR") of one or more battery cells within the suspect battery block. DCR tends to increase as a battery cell wears, ages or otherwise degrades, thus amplifying the cell voltage swing in response to a charging/ or discharging current pulse. Thus, battery cells with higher DCR values (weaker battery cells) will exhibit charging and discharging voltages closer to their operating limits during current pulses than cells with lower DCR values (stronger battery cells). Accordingly, even though the battery blocks in a battery pack are "Peak-Equalized Balanced" as illustrated in FIG. 1C and have similar voltages in a relaxed state (meaning they have similar OCV values), their voltages may be quite different during periods when significant currents are flowing through the battery pack (i.e., during charging events and discharging events) and therefore the battery blocks may operate at voltages near or exceeding the operating limits (i.e. the margins designated "Operating Margin High" and "Operating Margin Low" are both reduced).

In the example shown in FIG. 1D, Battery Block C swings asymmetrically with respect to the midpoint between high and low operating limits, operating with less margin (or "marginal voltage") with respect to the high limit than the low limit. That is, the difference between the High Operating Limit voltage (or "upper threshold") and the battery block charging voltage (i.e., battery block voltage when charging) is smaller than the difference between the Low Operating Limit voltage (or "lower threshold") and the battery block discharging voltage (i.e., battery block voltage when discharging). Expressed in the terms presented in FIG. 1D, "Operating Margin High" is smaller than "Operating Margin Low."

In one embodiment, exemplified by FIG. 1E, a battery management system manipulates the state of charge for anomalous battery blocks (i.e., battery blocks that exhibit anomalous charging/discharging voltage profiles as shown in FIG. 1D) to equalize the high and low operating limits. That is, the block SOC is adjusted until the peak-to-peak swing is nominally centered between the high and low operating limits and thus so that the difference between the High Operating Limit and the peak charging voltage is substantially equal to the difference between the peak discharging voltage (i.e., lowest voltage point) and the Low Operating Limit. In the specific example shown, the SOC value for Battery Block C has been reduced compared to FIG. 1D to increase the margin between the battery block charging voltage and the High Operating Limit (i.e., increasing the operating upper margin as it is initially smaller than the lower operating margin and thus the greater over-limit risk). After balancing the battery blocks in this manner (referred to herein as "margin-based balancing"), the worst case operating margin is increased, thus enabling a larger charging current (in this example) to be applied so that the overall performance of the battery pack is improved.

Figure 2:
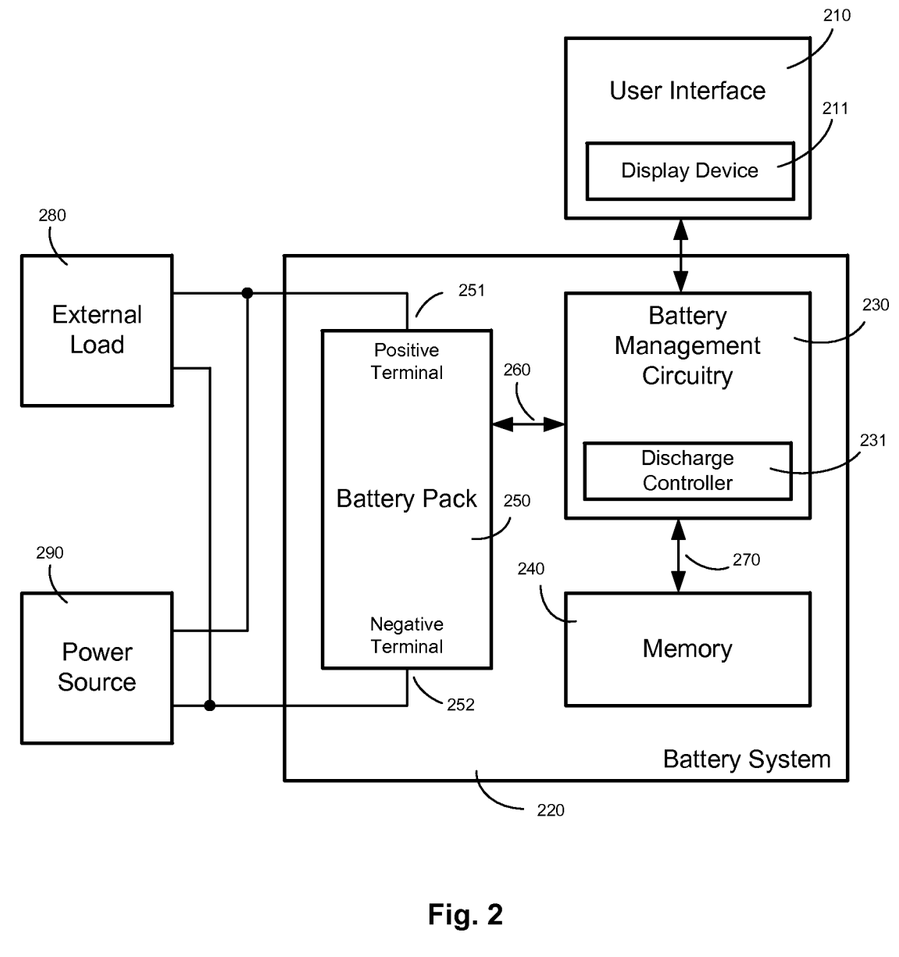
FIG. 2 illustrates one embodiment of a battery management system capable of improving battery pack performance.

FIG. 2 depicts one embodiment of a battery system 220 that may be used to implement the operations shown in FIGS. 4, 5, 6, 7, 8 and 9. The battery system includes battery management circuitry 230, memory 240 and the battery pack 250. The battery management circuitry 230 includes a discharge controller 231 that is capable of executing the operations described in FIGS. 4, 5, 6, 7, 8 and 9 to partially discharge the battery blocks in the battery pack. The battery management circuitry, which may be implemented at least in part by a programmed processor, is coupled to the battery pack via interconnect 260, which is used to transmit and receive multiple control and data signals to and from the battery pack. The battery management circuitry may also be used to identify battery blocks with various characteristics, such as anomalous behavior. The battery management circuitry is also coupled to the memory 240 which is used to store information including, but not limited to, software code and data associated with executing the sequence of operations in FIGS. 4, 5, 6, 7, 8 and 9. A user interface 210 is coupled to the battery management circuitry within the battery management system. This user interface is used to present (through the display device 211) and collect information to and from an operator of the system, the information presented including, without limitation, battery pack SOC, battery pack charging or discharging status, battery pack temperature, and electric vehicle (EV) range. The battery pack is coupled via positive and negative terminals 251 and 252 to an external load 280 (for example, the electric motor of the EV), and power source 290 (for example, a drive-time charging current source such as a regenerative braking system that delivers charging power during braking in an EV or HEV, or an electrical alternator or generator in an HEV). The battery system may include numerous other functional blocks in addition to or within the functional blocks shown, including programming and debug interfaces, maintenance and system-level data collection. The battery system, battery management circuitry and/or discharge controller may also include various functional logic blocks, such as status logic for determining whether the battery is in a rest state, pre-conditioning logic to draw pre-conditioning current from the battery (e.g., in response to detecting that the battery is in the rest state), voltage measurement logic to measure the OCV, state-of-charge determination logic to determine the state-of-charge of the battery based on the OCV, charge-balancing logic to balance the level of charge on the various battery blocks. Any or all of those logic blocks may be implemented by one or more programmed processors (including special-purposes processor(s), micro-controller(s), general-purpose processor(s), etc.) that execute a programmed sequence of instructions to carry out the various functions performed by the logic block.

Figure 3:
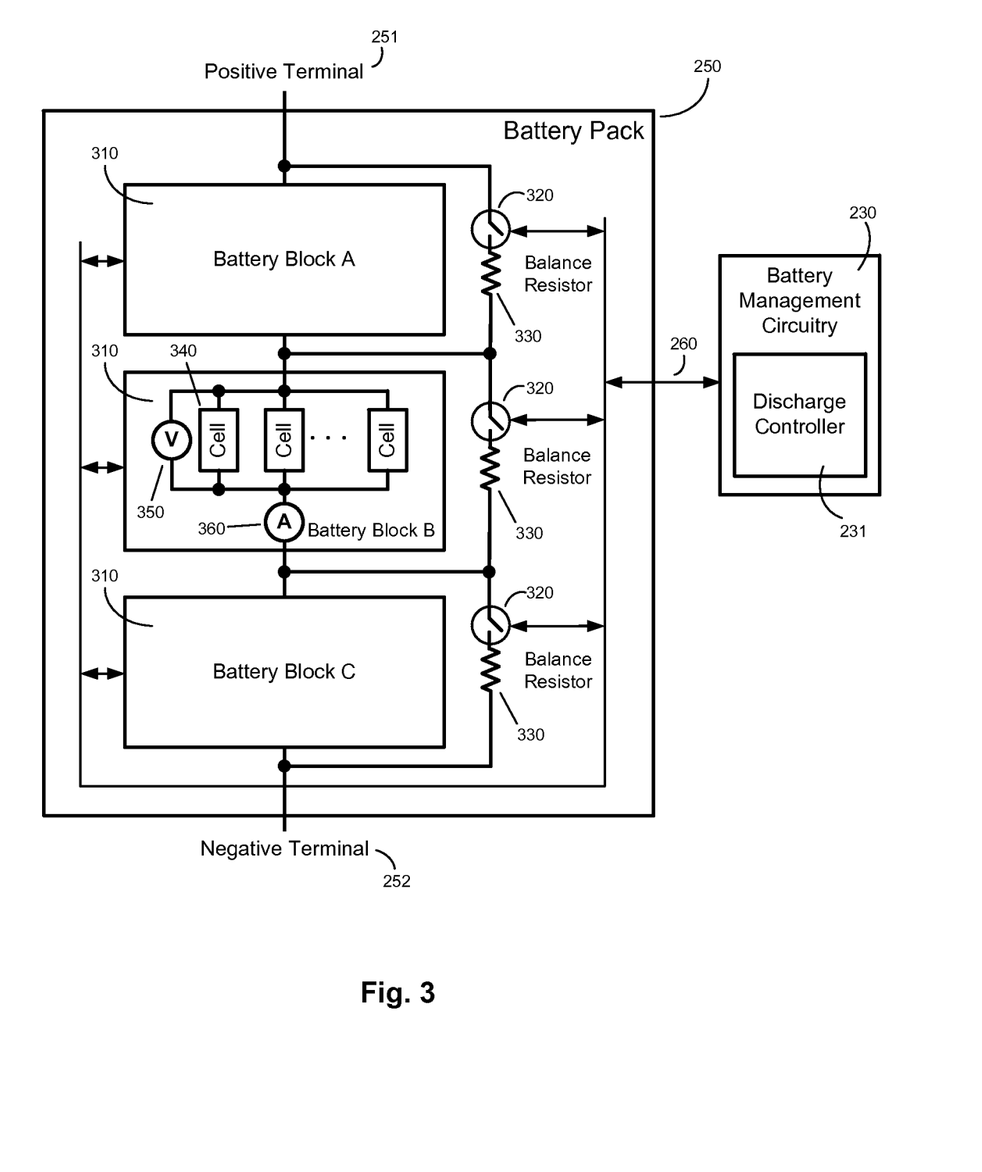
FIG. 3 illustrates one embodiment of a battery pack with circuitry for balancing the battery blocks.

FIG. 3 shows one embodiment of a battery pack 250 with circuitry controlled by a discharge controller (e.g., element 231 of FIG. 1) to discharge the battery blocks 310 contained within the battery pack. Each battery block 310 comprises multiple battery cells 340, along with voltage and current measurement devices, 350 and 360 respectively, which permit concurrent measurement of charging or discharging voltages and currents of all battery blocks. In other battery pack embodiments each or any of the battery blocks 310 may have more or fewer cells than shown FIG. 3. Thus, in higher power systems a battery block may include tens, hundreds or more battery cells, while in lower power systems a battery block may be constituted by a single battery cell. FIG. 3 shows the battery cells in a battery block connected in parallel. Other embodiments may have one or more of the battery cells connected in series. Also, while all voltage and current measurement devices are shown as being coupled to battery management circuitry 230 via the interconnect 260, separate interconnects could alternatively be employed. The battery cell or cells that constitute each battery block may be implemented by any practicable battery chemistry.

Figure 4:
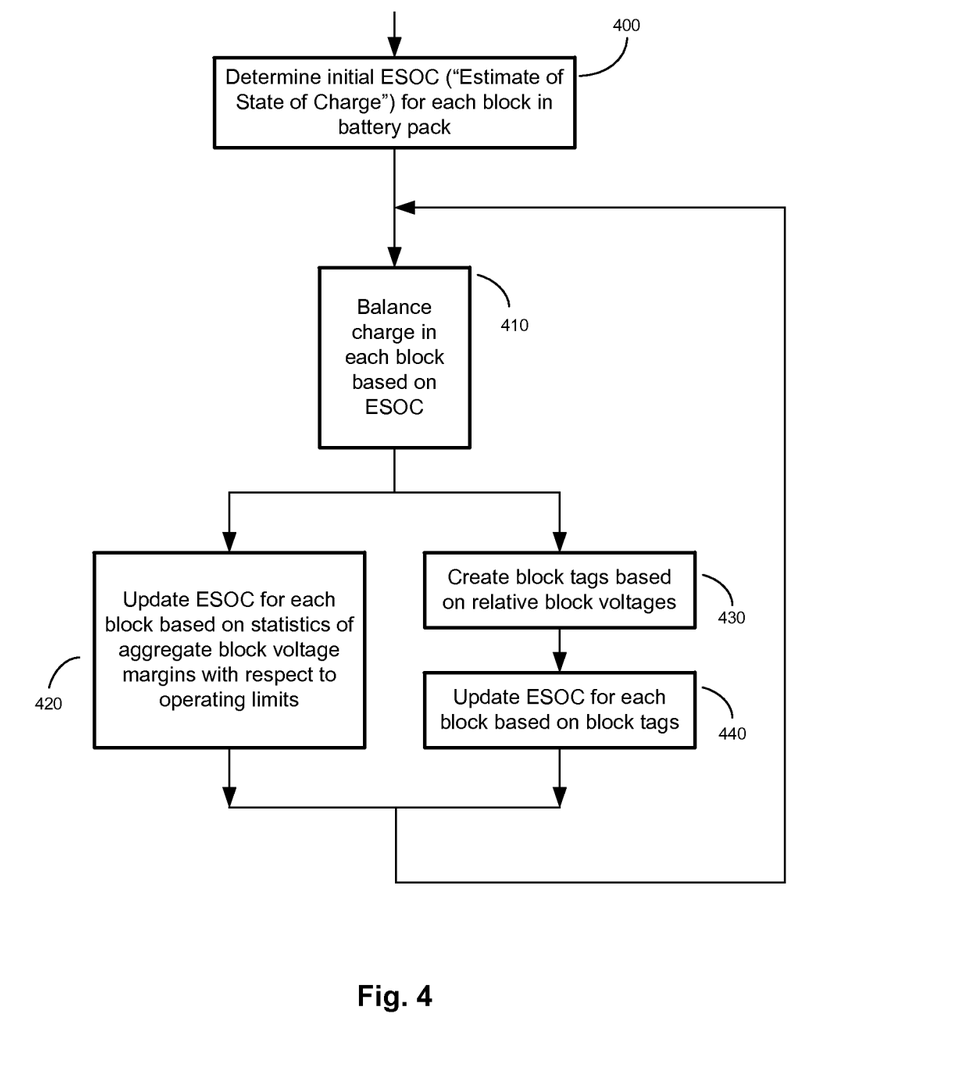
FIG. 4 shows an exemplary sequence of operations for improving the performance of a battery pack.

FIG. 4 illustrates one embodiment of a sequence of operations to improve the performance of a battery pack by balancing the battery blocks with reference to maximum or minimum battery pack voltages measured during the operation of the battery pack. The sequence utilizes an estimate of the state-of-charge of each battery block (ESOC). Starting at 400, an initial ESOC value for each battery block is determined. One embodiment may use an estimate of the SOC for the battery block based on a previously measured OCV. Other methods of determining the initial ESOC value may also be used. Next, all of the battery blocks are balanced with reference to their ESOC value at operation 410, an operation described in greater detail in reference to FIG. 5. The sequence continues by updating the ESOC value for each block based on either statistics of aggregate block voltage margins in 420 (an example of which is described in reference FIG. 6) or based upon relative block voltages through the combination of tag creation and update operations in 430 (described, for example, in FIG. 7) and 440 (described, for example, in FIG. 8) respectively. After the ESOC values for have been adjusted the sequence is repeated (iterated) at 410 to balance the charge in each battery block based on the updated ESOC values for each battery block. More specifically, in operations 420, 430 and 440, the respective ESOC values for all or selected battery blocks are manipulated to force a charge balancing operation in 410, thereby effecting relative SOC offsets between the various battery blocks to carry out the peak-equalized and/or margin-based charge balancing operations shown, for example, in FIGS. 1C and 1E. In operation 420, for example, statistical measures of aggregate block voltage margins (e.g., averaged high and low operating margins) are evaluated to adjust the ESOC of all battery blocks up or down uniformly. By contrast, in operations 430 and 440, the ESOC value of each battery block is independently adjusted based on a comparison of the charging/discharging voltage of a specific battery block to the charging/discharging voltages of the other battery blocks. In the embodiment of FIG. 4, operation 410 is executed in series with operations 420 and 430/440, and operations 420 and 430/440 are executed in parallel. In alternative embodiments, the operations 410, 420, 430 and 440 (or any one or more of them) may be executed in series, in parallel, periodically or in response to prescribed or programmatically specified conditions or events.

Figure 5:
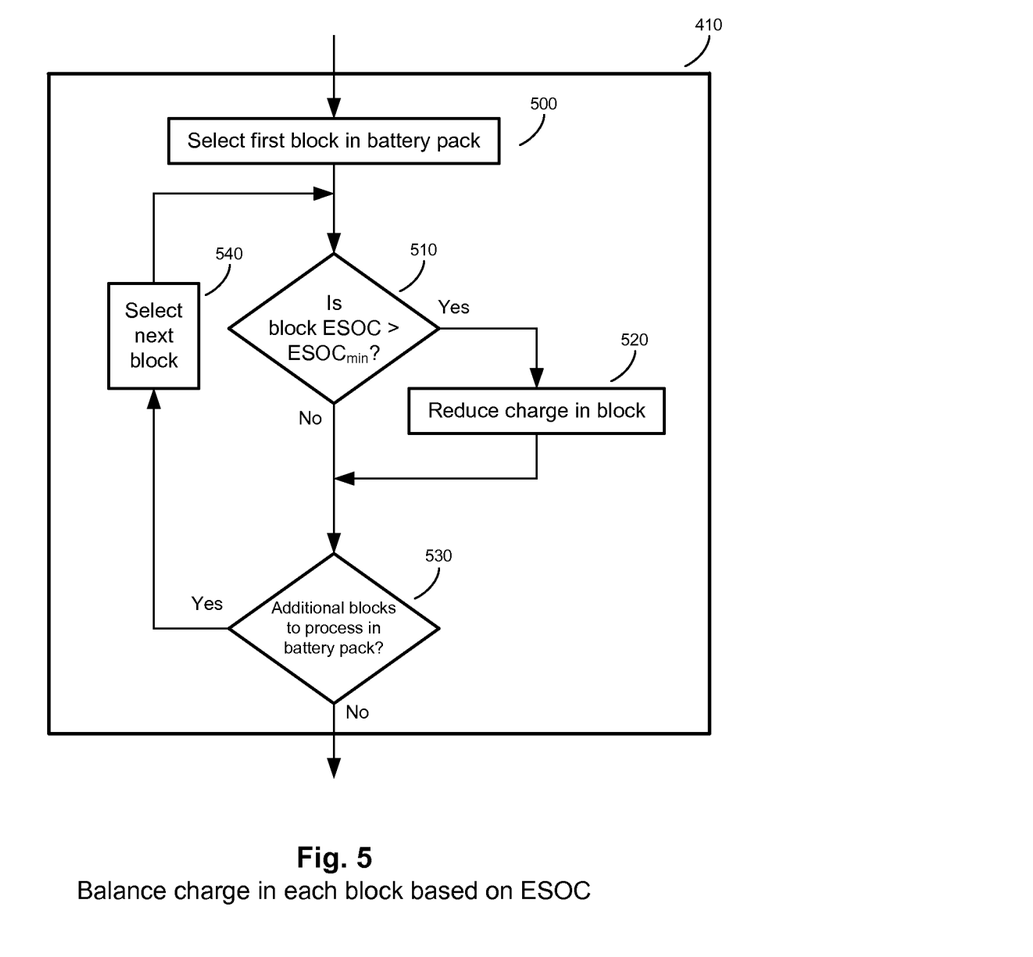
FIG. 5 shows an exemplary sequence of operations for balancing the charge in each battery block in a battery pack.

FIG. 5 illustrates an exemplary sequence of operations used to balance the charge in each of the battery blocks based on the ESOC for each block. Starting at operation 500, the first battery block in the battery pack is selected. Next, the ESOC value of the selected battery block is compared to a fixed or dynamically determined minimum value of ESOC, $ESOC_{min}$. One embodiment may determine $ESOC_{min}$ based on the minimum value of all battery block ESOC values. Other embodiments may use different methods to determine $ESOC_{min}$. If the battery block ESOC value is greater than $ESOC_{min}$ (i.e. affirmative determination at 510) the battery block is "balanced" in operation 520 by removing charge using the balance resistors 330 controlled by the discharge controller 231. The amount of charge removed (or "bled" or "discharged") from a given battery block may depend on a number of factors including, but not limited to, battery pack age, discharge cycles, ESOC value, temperature and/or may be specified by programming a specified value or factors to be accounted for when determining the amount of charge to remove within one or more programmable registers of the battery management circuitry shown in FIG. 2. Instead of passive charge-balancing effected by switchably coupling balance resistors or other load elements to selected battery blocks, the battery blocks or any subset thereof may be actively balanced by discharging one or more battery blocks into one or more other battery blocks (e.g., transferring charge between battery blocks through a capacitive or inductive coupling circuit). Further, instead of or in addition to balancing through battery block discharging, charge may be selectively added to one or more battery blocks from an external charging source (i.e., charging a single block or at least fewer than all the battery blocks in the battery pack). After the charge in the battery block has been reduced in operation 520, or if the battery block ESOC was less than or equal to $ESOC_{min}$, the next battery block (if any) in the battery pack is selected at 540. If there are no additional battery blocks to process (i.e. negative determination at 530) the sequence completes.

Figure 6:
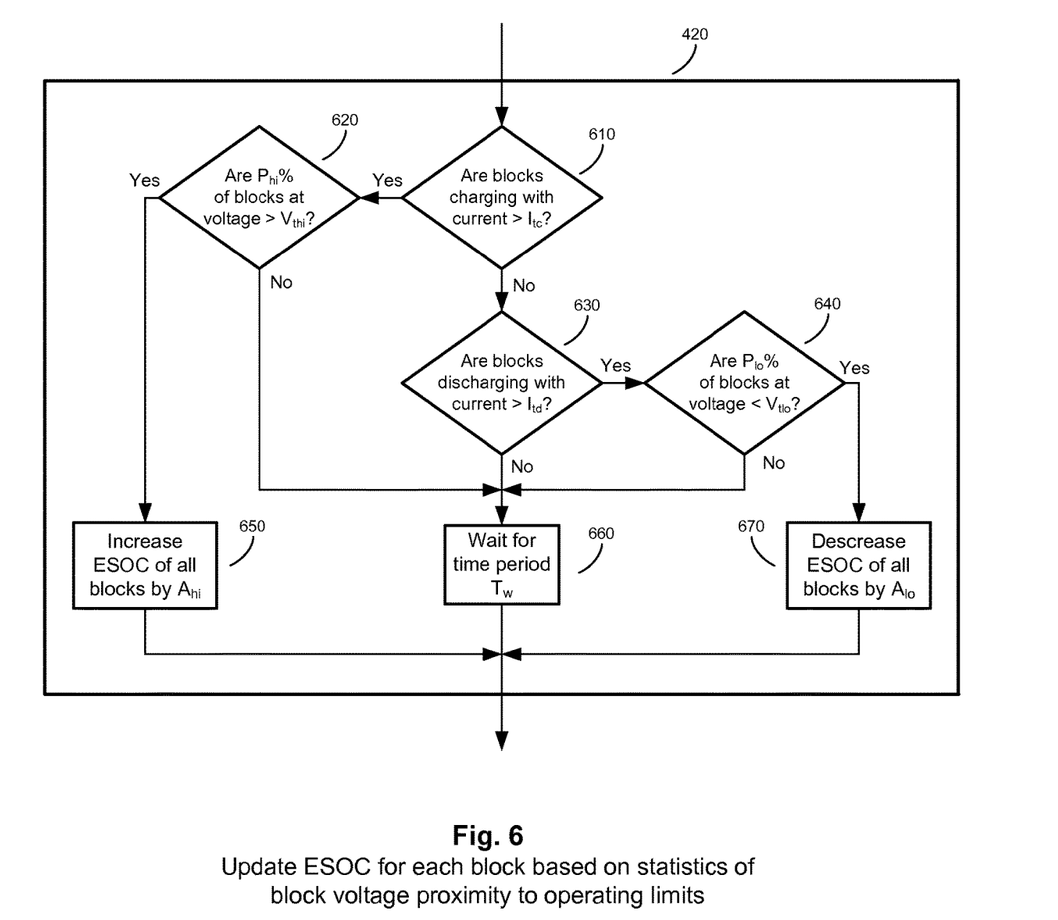
FIG. 6 shows an exemplary sequence of operations for adjusting the estimate of the SOC of battery blocks within a battery pack based on statistics of battery block voltage.

FIG. 6 shows an exemplary sequence of operations that adjusts the ESOC of all battery blocks uniformly based on statistics of system-wide battery block voltage margin, and thus may be used to implement ESOC update operation 420 of FIG. 4. The sequence begins at 610 where the charging current flowing through the battery blocks is evaluated. If the charging current is greater than $I_{tc}$, (i.e. affirmative determination at 610) then the sequence continues at 620. If the charging current is less than or equal to $I_{tc}$, or if the battery pack is discharging, the sequence continues at 630. At 620, if more than $P_{hi}$ percent of the battery blocks have voltages greater than $V_{thi}$ (i.e. affirmative determination at 620) then the sequence continues at 650. If the percentage of battery blocks having voltages greater than $V_{thi}$ is less than or equal to $P_{hi}$, percent, the sequence continues at 660. At operation 650, the ESOC of all blocks is increased by $A_{hi}$, which may be a percentage of the existing ESOC value or an absolute amount. At 630 the discharge current flowing through the battery blocks is evaluated. If the discharge current is greater than $I_{td}$, (i.e. affirmative determination at 630), the sequence continues at 640. If the discharge current is less than or equal to $I_{td}$, then the sequence continues at 660. At 640, if more than $P_{lo}$ percent of the battery blocks have voltages less than $V_{tlo}$ (i.e. affirmative determination at 640) then the sequence continues at 670. If the percentage of battery blocks having voltages less than $V_{tlo}$ is less than or equal to $P_{lo}$ percent, the sequence continues at 660. At operation 670 the ESOC of all blocks is decreased by $A_{lo}$, which may be a percentage of the existing ESOC value or an absolute amount. At operation 660, the sequence waits for period of time, $T_w$. When either operation 650, 660 or 670 is completed, sequence 420 is deemed to be complete. In one embodiment, for example, upon determining that a threshold number of battery blocks have achieved voltages during charging that are within a predetermined or programmed proximity to the maximum operating limit (which may compromise the safe and reliable operation of the battery pack), then the ESOC of all battery blocks is adjusted up by a predetermined amount. This ESOC increase will cause the battery blocks to be discharged in operation 410 which will consequently reduce their operating voltages and thus increase the margin between the operating limit and the battery block voltages during charging.

In one embodiment the parameters $I_{tc}$, $I_{td}$, $P_{hi}$, $P_{lo}$, $V_{thi}$, $V_{tlo}$), $A_{hi}$, $A_{lo}$ and $T_w$ are predetermined and fixed. In other embodiments these parameters dynamically may be calculated based on the current system operating conditions and/or based upon factors including, but not limited to battery pack age, discharge cycles, ESOC value, temperature and so forth.

Figure 7:
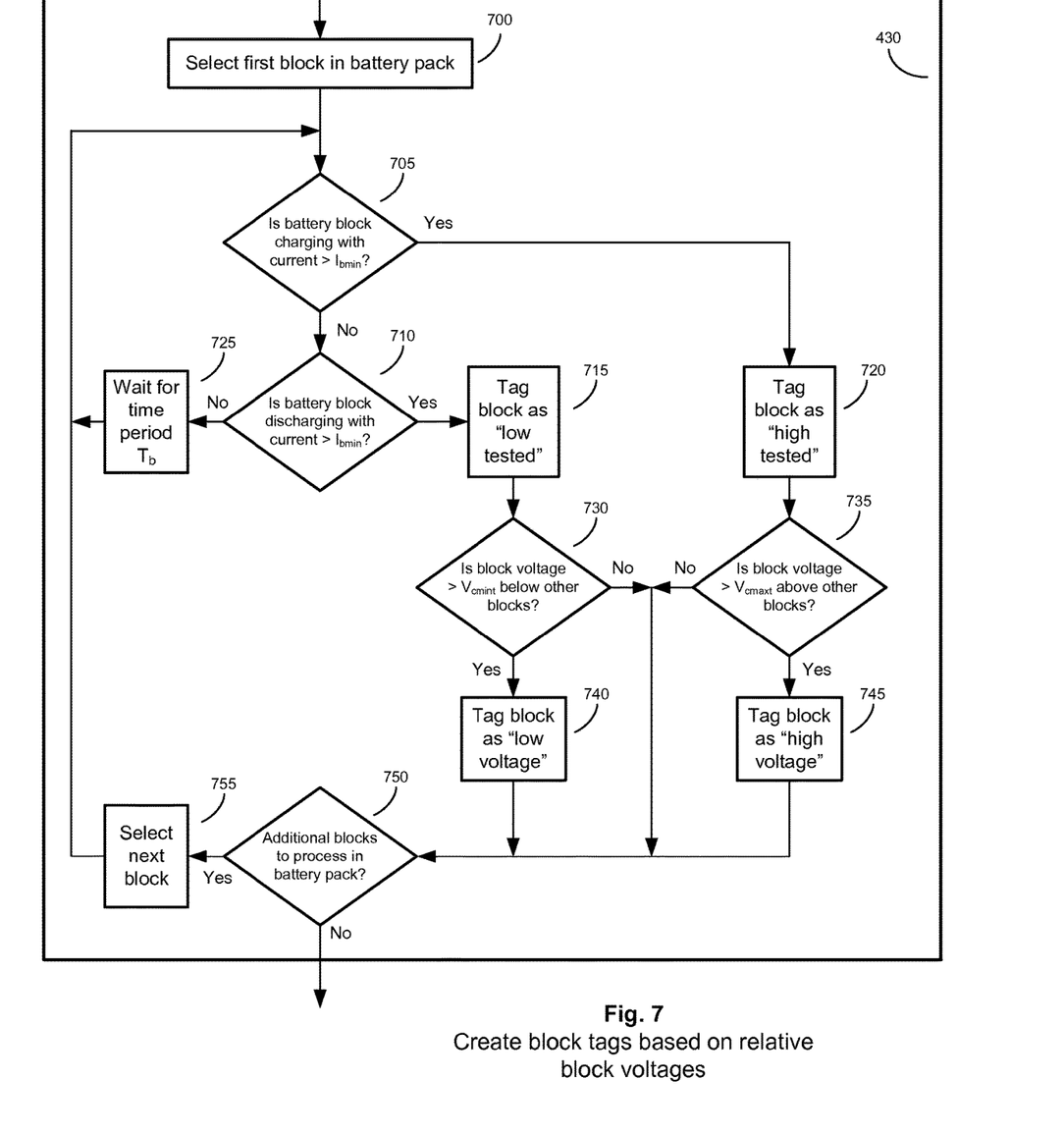
FIG. 7 shows an exemplary sequence of operations for creating block tags based on relative block voltages.

FIG. 7 shows an exemplary sequence of operations that may be executed to create tags that store (in the battery system memory 240) characteristics of each battery block when significant current is flowing through that battery block. Starting at 700, a battery block in the battery pack is selected and becomes "the battery block" (and "the selected block") for purposes of the remaining operations. At operation 705, if the current flowing through the battery block (and thus through all series-coupled battery blocks within the battery pack) is determined to be a charging current greater than $I_{bmin}$ (i.e. affirmative determination at 705) then the sequence proceeds to 720. Otherwise, the battery block current is compared with a lower threshold $I_{bmin}$ at 710 and, if less than or equal to $I_{bmin}$, the sequence continues at 715. At 720, the selected battery block is tagged as having been "high tested" (i.e., tested while significant charging current is flowing into the battery pack). The tag itself may be effected, for example, by storing a flag or other indicator in a tag memory (e.g., within element 240 of FIG. 2). At the next operation, 735, the selected block voltage is compared to a statistical combination of all other battery block voltages (the 'pack voltage'). In one embodiment, for example, an arithmetic mean is used for the statistical combination. Different statistical combinations or other representations of the pack voltage may be used in other embodiments, such as the maximum or minimum battery block voltage in the pack or the arithmetic mean of all battery block voltages, excluding the voltage of the selected block.

Continuing with FIG. 7, if the selected block voltage is $V_{cmaxt}$ or more above the pack voltage (i.e. affirmative determination at 735), the selected block is tagged at 745 as being "high voltage" to indicate that the block voltage is higher than the pack voltage when a significant charging current is flowing through the battery pack. Otherwise, if the difference between the selected block voltage and the pack voltage does not exceed $V_{cmaxt}$ (i.e., negative determination at 735), then the system determines at 750 whether all the battery blocks have been processed, exiting the tag creation operation if so, and selecting the next block at 755 before repeating the operations that start at decision 705.

Returning to decision 710, if the current flowing through the battery pack is determined to be a discharging current greater than $I_{bmin}$, the tag creation sequence continues at 715. If the current flowing through the battery pack is a charging current or less than or equal to $I_{bmin}$, the sequence continues at operation 725 where the sequence waits for a time period of $T_b$ before continuing back at 705 without changing the selected block (i.e. the same block will be evaluated again at operations 705 and 710). At operation 715, the block is tagged as being "low tested", indicating that the block has been evaluated while a significant discharging current was flowing through the battery pack. At the next operation, 730, the selected block voltage is compared to the pack voltage. If the selected block voltage is more than $V_{cmint}$ lower than the pack voltage (i.e. affirmative determination at 730) the sequence continues at 740. If the difference between the selected block voltage and the pack voltage does not exceed $V_{cmint}$ (i.e., selected block voltage is less than $V_{Cmint}$ below the pack voltage), then the sequence continues at 750. At operation 740, the block is tagged as being "low voltage", indicating that the block has a voltage that is lower than the pack voltage when a significant discharging current is flowing through the battery pack. If additional battery blocks are available to process at operation 750 (i.e. affirmative determination at 750), the next block is selected at 755 and the sequence is repeated starting at 705. Otherwise, the tag creation sequence is deemed complete.

Figure 8:
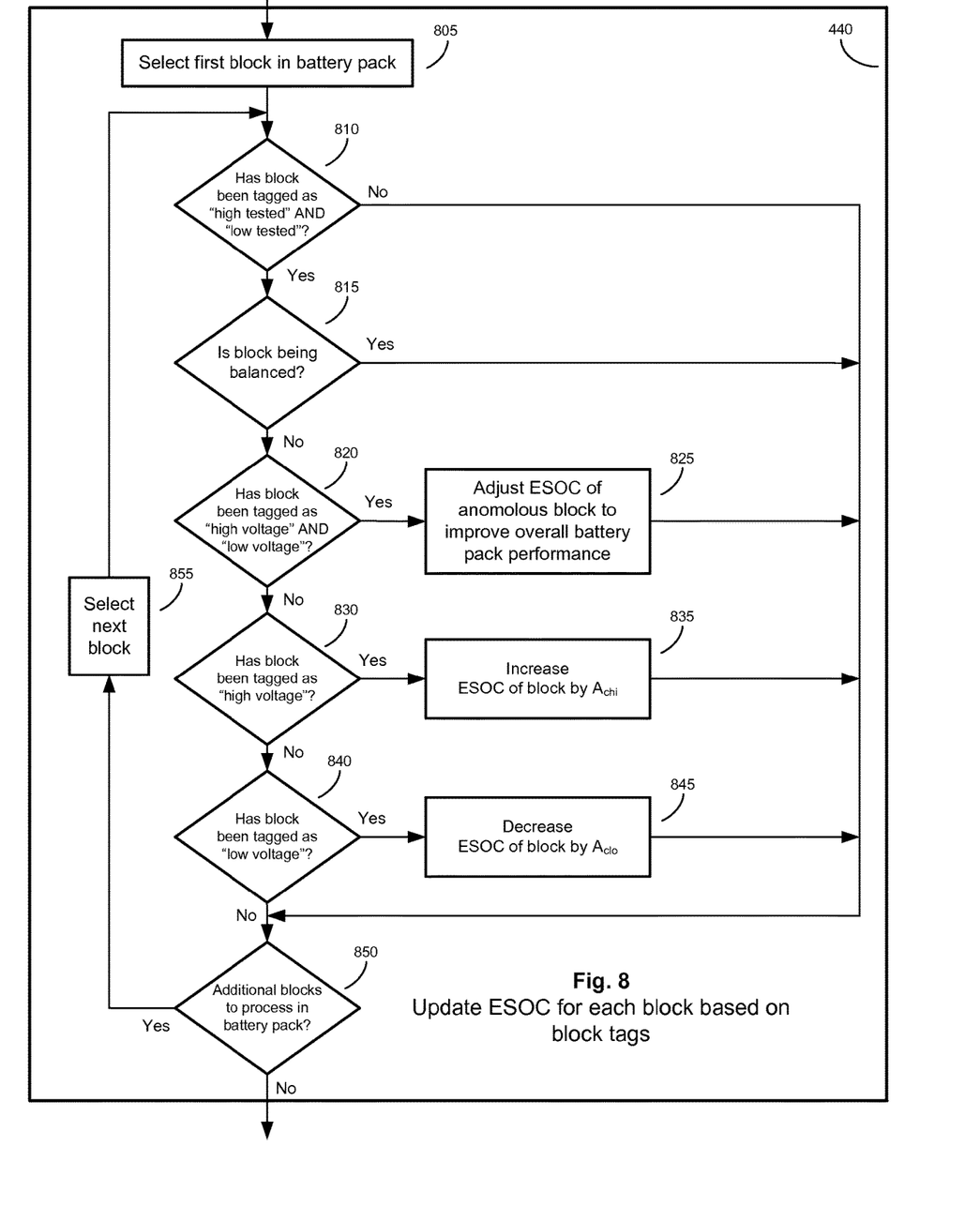
FIG. 8 shows an exemplary sequence of operations for adjusting the estimate of the SOC of battery blocks based on block tags.

FIG. 8 shows an exemplary sequence of operations executed to adjust or update the estimate of SOC based upon the block tags created by the sequence shown in FIG. 7, and thus an operational sequence that may be used to implement operation 440 of FIG. 4. At 805, the first battery block in the battery pack is selected and becomes the "selected block" for the operations that follow. At 810, information stored in the tag memory (e.g., element 140 of FIG. 1) is examined to determine if the selected block has been tagged as both "high tested" and "low tested", indicating that the selected block has been evaluated both when significant charging current was flowing through the battery pack and separately when significant discharging current was flowing through the battery pack. If the selected block has been tagged as both "high tested" and "low tested", then the sequence continues at 815 (i.e. affirmative determination at 810), otherwise, the sequence continues at 850. At 815 it is determined if the selected block is currently being balanced in operation 520, meaning that current is being discharged from the selected block. If the selected block is being balanced (i.e. affirmative determination at 815) then the sequence continues at operation 850. If the selected block is not being balanced the sequence continues at 820.

Figure 9:
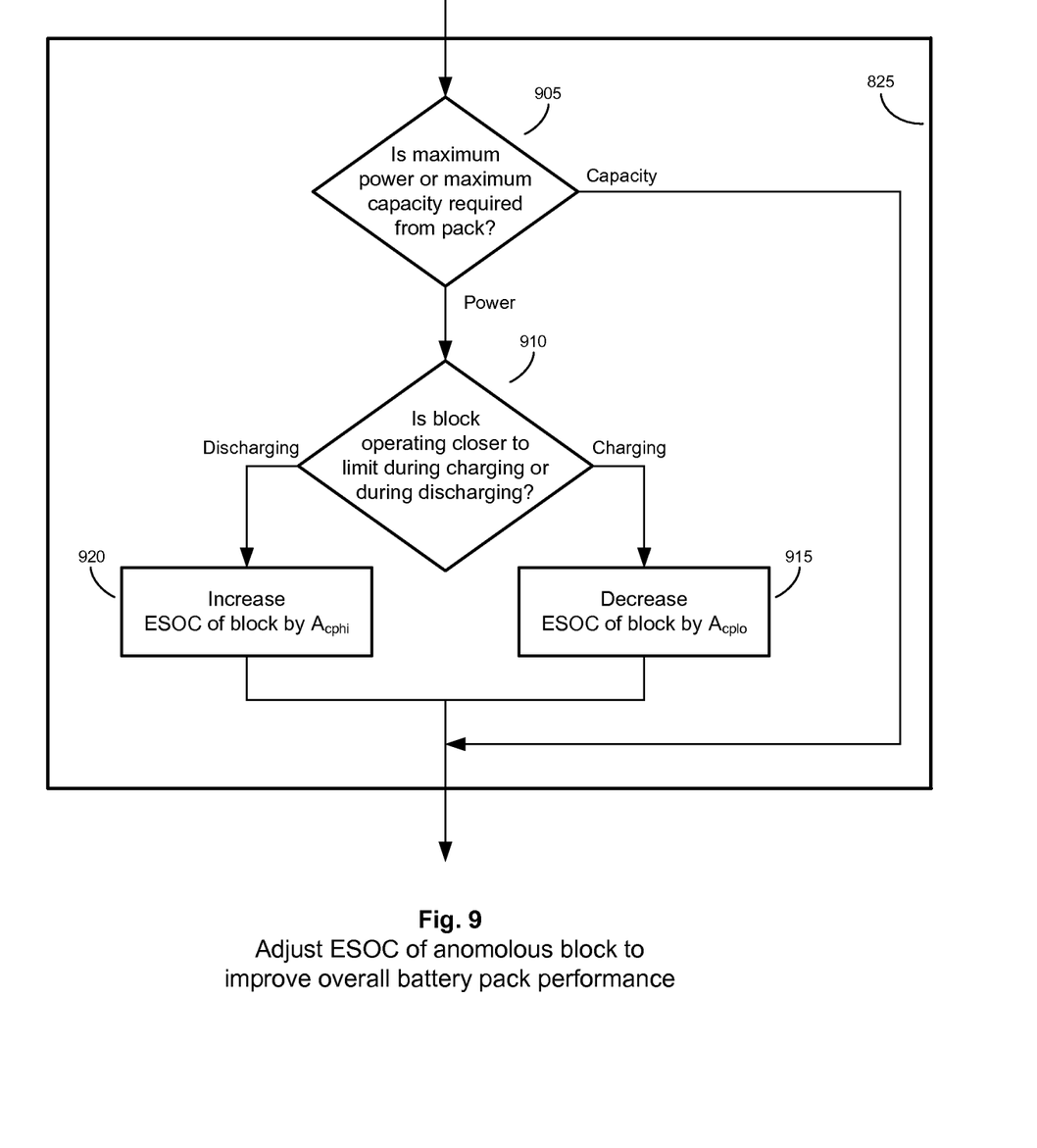
FIG. 9 shows an exemplary sequence of operations for adjusting the estimate of the SOC of anomalous battery blocks to improve overall battery pack performance.

At 820, if the battery block has been tagged as both "high voltage" and "low voltage", then the sequence continues at 825, otherwise the sequence continues at 830. At 825, the selected block has been tagged as both "high voltage" and "low voltage", and is therefore an anomalous block (e.g., defective in some manner relating to its constituent battery cell(s) and/or interconnections thereto, or otherwise having significantly lower performance than other battery blocks) and thus requires anomalous adjustment. This anomalous adjustment is illustrated in FIG. 9 and described below. When operation 825 completes, the sequence continues at 850.

Referring again to operation 830, if the selected block has been tagged with "high voltage", then at 835 the ESOC of the selected block is increased by $A_{chi}$, which may be a percentage of the existing ESOC value or an absolute amount. This increase in ESOC will cause the charge in the selected block to be reduced (i.e., by virtue of operation 520 of FIG. 5, assuming that the operations shown there are executed iteratively to detect and respond to ESOC adjustments), reducing the selected block voltage to be similar to the other battery blocks when charging current is flowing (i.e., equalizing the upper peak voltages of the blocks), thus 'performance balancing' the battery pack as described in reference to FIG. 1C. When operation 835 completes, the sequence continues at 850.

If the selected block has not been tagged as a "high voltage" block (i.e., negative determination at 830), the sequence proceeds to 840. If the selected block has been tagged with "low voltage" (i.e. affirmative determination at 840, indicating that the selected block may have a lower SOC than other battery blocks), then at 845 the ESOC of the selected block is decreased by $A_{clo}$, which may be a percentage of the existing ESOC value or an absolute amount. This decrease in ESOC will cause the charge in the selected block to be increased relative to other battery blocks (i.e., by virtue of operations 510 and 520 of FIG. 5 which will establish the now-decreased ESOC of the selected block as the new ESOC minimum, followed by charge-bleeding the other battery blocks to match the new ESOC minimum), thereby equalizing the lower peak voltages (i.e., minimum block voltage during discharge) of the battery blocks and thus 'margin-based balancing' the battery pack as described in reference to FIG. 1C.

If the selected block has been tagged as neither a "high voltage" block nor a "low voltage" block, then at 850 the battery management system determines if there are additional battery blocks to process. If there are additional battery blocks to process, the sequence loops back to operation 855 to process the next battery block (i.e., the new "selected block"). Otherwise, the ESOC update sequence is deemed complete.

Still referring to FIG. 8, the parameters $A_{chi}$ and $A_{clo}$ are predetermined and may be programmed or fixed (i.e., established by design) within the battery management system in one embodiment. In other embodiments the battery management system may determine these parameters dynamically based on the system operating conditions and/or additional factors including, but not limited to, battery pack age, discharge cycles, ESOC value, temperature, etc.

FIG. 9 shows an exemplary sequence of operations that adjust the estimate of SOC for an anomalous block that is defective in some manner or has significantly lower performance than other battery blocks. The operations shown in FIG. 9 trigger the change in battery block charge (and consequently SOC) that results in the margin-based balancing described in reference to FIG. 1E. Starting at operation 905, it is determined if either maximum power or maximum capacity is required from the battery pack. For example, if the battery pack is installed in an electric vehicle, with the battery pack as the sole motive power source, it may be preferably to maximize battery pack capacity instead of power and thus maximize vehicle driving range. Conversely, if the battery pack is installed in a hybrid electric vehicle, maximum power, providing enhanced vehicle acceleration and braking, may be preferred. If maximum capacity is required from the battery pack, then the sequence completes and the ESOC of the block is not adjusted. If maximum power is required from the battery pack then the sequence continues at 810. At operation 810, analysis of block voltages during charging and discharging is performed to determine if the block voltage is closer to the operating limit during charging or during discharging. If closer during discharging, the sequence continues at 920, otherwise the sequence continues at 915. At 920 the ESOC of the block is increased by $A_{cphi}$. This increase in ESOC will cause the charge in the selected block to be reduced (i.e., by virtue of operation 520 of FIG. 5), providing more margin between the battery block charging voltage and the high operating limit voltage and thus equalizing the upper and lower operating margins (and also reducing the anomalous block voltage to be similar to the other battery blocks when charging current is flowing).

At 915 the ESOC of the block is decreased by $A_{cplo}$. This decrease in ESOC will cause the charge in the anomalous block to be increased relative to other battery blocks (i.e., by virtue of operations 510 and 520 of FIG. 5), providing more margin between the battery block discharging voltage and thus equalizing the upper and lower operating margins (and also increasing the anomalous block voltage to be similar to the other battery blocks when discharging current is flowing).

After completing either of operations 915 or 920, the anomalous block ESOC adjustment sequence is complete. As with other parameters, $A_{cphi}$ and $A_{cplo}$ may be predetermined and programmatically specified or fixed by design. Alternatively, these parameters may be determined dynamically based on system operating conditions and/or additional factors including, but not limited to, battery pack age, discharge cycles, ESOC value, temperature, etc.

In the foregoing description and in the accompanying drawings, specific terminology and drawing symbols have been set forth to provide a thorough understanding of the present invention. In some instances, the terminology and symbols may imply specific details that are not required to practice the invention. For example, the term "coupled" is used herein to express a direct connection as well as a connection through one or more intervening circuits or structures. Device or system "programming" may include, for example and without limitation, loading a control value into a register, one-time programmable-circuit (e.g., blowing fuses within a configuration circuit during device production) or other storage circuit within an integrated circuit device of the host system (or host device) and thereby control an operational aspect of the host system or establish a host system configuration. The terms "exemplary" and "embodiment" are used to express an example, not a preference or requirement. Signal paths that appear as single conductors may include multiple conductors and vice-versa, and components shown as being included within or forming part of other components may instead be disposed separately from such other components. With regard to flow diagrams and the like, the order of operations may be different from those shown and, where practical, depicted operations may be omitted and/or further operations added.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a battery system having a plurality of battery blocks coupled in series between terminals of a battery pack, the method comprising:
   measuring respective charging and discharging voltages of the battery blocks while charging and discharging the battery blocks;
   determining a state-of-charge of the battery pack based, at least in part, on the charging and discharging voltages of the battery blocks;
   detecting an anomalous battery block exhibiting outlier upper and lower peak voltages with both upper peak voltage, during charging, and lower peak voltage, during discharging, exceeding statistical thresholds;
   adjusting a state-of-charge of one or more of the battery blocks downward, responsive to determining that an upper peak battery block voltage of each of the one or more of the battery blocks during the charging reaches a predetermined proximity to a high operating limit that prevents damage during the charging, wherein the adjusting downward comprises discharging the one or more of the battery blocks into one or more other battery blocks;
   adjusting a state-of-charge of a further one or more of the battery blocks upward, responsive to determining that a lower peak battery block voltage of each of the further one or more battery blocks during the discharging reaches a further predetermined proximity to a low operating limit that prevents damage during the discharging; and
   adjusting a state-of-charge of the anomalous battery block to center the outlier upper peak voltage and the outlier lower peak voltage, relative to the high operating limit and the low operating limit.

2. The method of claim 1 wherein charging the battery blocks comprises supplying a current pulse to the battery pack via the battery pack terminals.

3. The method of claim 1 wherein charging the battery blocks comprises supplying current from a regenerative braking system within a hybrid electric vehicle or an electric vehicle to the battery pack via the battery pack terminals.

4. The method of claim 1 wherein measuring respective charging voltages of the battery blocks during the first interval comprises measuring each of the battery block voltages concurrently.

5. The method of claim 1 wherein determining a state-of-charge comprises identifying a first battery block of the battery blocks that has a charging voltage higher than at least a second battery block of the battery blocks and discharging the first battery block to reduce the difference between the charging voltages of the first and second battery blocks.

6. The method of claim 5 wherein discharging the first battery block comprises switchably coupling balance resistors to the battery block.

7. The method of claim 1 further comprising displaying the state-of-charge of the battery pack to the operator of a hybrid electric vehicle or an electric vehicle.

8. The method of claim 1 further comprising determining a driving range of a hybrid electric vehicle or an electric vehicle based, at least in part, on the state-of-charge of the battery pack.

9. The method of claim 8 further comprising displaying the driving range to the operator of the hybrid electric vehicle or the electric vehicle.

10. The method of claim 1 wherein determining the state-of-charge of the battery pack based, at least in part, on the charging voltages of the battery blocks comprises:

measuring respective open-circuit voltages of the battery blocks;

generating an initial estimate of the state-of-charge of the battery pack based on the open-circuit voltages of the battery blocks; and adjusting the initial estimate of the state-of-charge of the battery pack based, at least in part, on the charging voltages of the battery blocks.

11. A method of operation within a battery system having a plurality of battery blocks coupled in series between terminals of a battery pack, the method comprising:

measuring respective charging and discharging voltages of the battery blocks while charging and discharging the battery blocks;

determining a state-of-charge of the battery pack based, at least in part, on the charging and discharging voltages of the battery blocks;

adjusting a state-of-charge of one or more of the battery blocks, responsive to determining that an upper peak battery block voltage of each of the one or more of the battery blocks during the charging is within a predetermined proximity to a high operating limit preventing damage during the charging, or determining that a lower peak battery block voltage of each of the one or more battery blocks during the discharging is within a further predetermined proximity to a low operating limit preventing damage during the discharging, so as to center the upper peak battery block voltage and the lower peak battery block voltage of each of the one or more of the battery blocks relative to the high operating limit and the low operating limit;

detecting an anomalous battery block exhibiting outlier upper and lower peak voltages with both upper peak voltage, during charging, and lower peak voltage, during discharging, exceeding statistical thresholds; and adjusting a state-of-charge of the anomalous battery block to center the outlier upper peak voltage and the outlier lower peak voltage, relative to the high operating limit and the low operating limit, wherein the adjusting comprises discharging the one or more of the battery blocks into one or more other battery blocks.

12. A battery management system to control a battery system having a plurality of battery blocks coupled in series between terminals of a battery pack, the battery management system comprising:

one or more voltage measurement inputs to receive respective charging and discharging voltage measurements of the battery blocks while the battery blocks are being charged and discharged;

state-of-charge determination logic to determine a state-of-charge of the battery pack based, at least in part, on the charging and discharging voltage measurements received via the voltage measurement inputs;

state-of-charge adjusting logic for adjusting a state-of-charge of respective battery blocks wherein a state-of-charge of one or more of the battery blocks is adjusted downward responsive to determining that an upper peak battery block voltage of each of the one or more of the battery blocks during the charging is within a predetermined proximity of a high operating limit that acts to prevent damage during the charging, wherein the adjusting downward comprises discharging the one or more of the battery blocks into one or more other battery blocks, and wherein a state-of-charge of a further one or more of the battery blocks is adjusted upward responsive to determining that a lower peak battery block voltage of each of the further one or more of the battery blocks during the discharging is within a further predetermined proximity of a low operating limit that acts to prevent damage during the discharging; and the state-of-charge adjusting logic further for detecting an anomalous battery block exhibiting outlier upper and lower peak voltages with both upper peak voltage, during charging, and lower peak voltage, during discharging, exceeding statistical thresholds for the battery blocks, and adjusting a state-of-charge of the anomalous battery block to center the outlier upper peak voltage and the outlier lower peak voltage, relative to the high operating limit and the low operating limit.

13. The battery management system of claim 12 wherein the state-of-charge determination logic further comprises outputs that indicate a state-of-charge of each of the respective battery blocks in the battery pack.

14. The battery management system of claim 12 wherein the battery system is disposed within an electric/hybrid-electric vehicle.

15. The battery management system of claim 12 wherein the number of charging voltage measurement inputs is equal to the number of battery blocks.

16. The battery management system of claim 12 wherein the state-of-charge determination logic is implemented at least in part by a programmed processor.

17. The battery management system of claim 12 wherein the battery system is disposed within an electric/hybrid-electric vehicle, the battery management system further comprising an output to provide a value corresponding to the state-of-charge of the battery pack to an operator display device disposed within the hybrid electric vehicle or the electric vehicle, the operator display device to display information corresponding to the state-of-charge of the battery pack to an operator of the electric/hybrid-electric vehicle.

18. The battery management system of claim 12 wherein the battery system is disposed within an electric/hybrid-electric vehicle, the battery management system further comprising driving range determination logic to determine, based at least in part on a value received from the state-of-charge determination logic that indicates the state-of-charge of the battery pack, a driving range of electric/hybrid-electric vehicle.

19. The battery management system of claim 18 further comprising an output to provide a value corresponding to the driving range of the electric/hybrid-electric vehicle to an operator display device disposed within the electric/hybrid-electric vehicle, the operator display device to display information corresponding to the value corresponding to the driving range to an operator of the electric/hybrid-electric vehicle.

20. A battery management system to control a battery system having a plurality of battery blocks coupled in series between terminals of a battery pack, each battery block having a plurality of cells in parallel, the battery management system comprising:

a plurality of voltage measurement devices corresponding to the plurality of battery blocks, each voltage measurement device across and in parallel with the plurality of cells in parallel in a corresponding one of the plurality of battery blocks;

a plurality of current measurement devices corresponding to the plurality of battery blocks, each current measurement device in series with the plurality of cells in parallel in a corresponding one of the plurality of battery blocks;

a plurality of switch and balance resistor devices corresponding to the plurality of battery blocks, each switch and balance resistor device across and in parallel with the plurality of cells in parallel in a corresponding one of the plurality of battery blocks; and battery management circuitry coupled to the plurality of voltage measurement devices, the plurality of current measurement devices and the plurality of switch and balance resistor devices to adjust state-of-charge of each of the plurality of battery blocks and detect an anomalous battery block exhibiting outlier upper and lower peak voltages with both upper peak voltage, during charging, and lower peak voltage, during discharging, exceeding statistical thresholds and adjust state-of-charge the anomalous battery block relative to other battery blocks, wherein during the discharging, one of the plurality of battery blocks is discharged into one or more other battery blocks.

* * * * *